(12) United States Patent
Moussavi et al.

(10) Patent No.: US 6,228,765 B1
(45) Date of Patent: May 8, 2001

(54) STRUCTURE AND METHOD FOR FORMING CONDUCTIVE MEMBERS IN AN INTEGRATED CIRCUIT

(75) Inventors: Mehdi Moussavi, Corenc; Yves Morand, Grenoble, both of (FR)

(73) Assignees: STMicroelectronics S.A., Gentilly; Commissariat Al'Energie Atomique, Paris, both of (FR)

( * ) Notice: Subject to any disclaimer, the term of this patent is extended or adjusted under 35 U.S.C. 154(b) by 0 days.

(21) Appl. No.: 09/222,030

(22) Filed: Dec. 29, 1998

(30) Foreign Application Priority Data

Dec. 30, 1997 (FR) .................................................. 97 16855

(51) Int. Cl.$^7$ ..................................................... H01L 21/44
(52) U.S. Cl. ............................................................ 438/678
(58) Field of Search ..................................... 438/674, 677, 438/678, 622, 626, 637, 629, 648, 409, 633

(56) References Cited

U.S. PATENT DOCUMENTS 5,098,860 * 3/1992 Chakravorty et al. ............... 437/195
5,474,651 12/1995 Huebner ............................. 156/644.1

FOREIGN PATENT DOCUMENTS 01 144 752    6/1985   (EP) .

* cited by examiner

*Primary Examiner*—Matthew Smith
*Assistant Examiner*—Calvin Lee
(74) *Attorney, Agent, or Firm*—Theodore E. Galanthay; Robert Iannucci; Seed IP Law Group

(57) ABSTRACT

The invention provides a method of forming conductive members in an integrated circuit comprising the steps of depositing a first dielectric layer on a substrate; depositing a first conductive layer; depositing a second dielectric layer; forming cavities extending at least partially through the first dielectric layer; forming a second conductive layer on internal surfaces of the cavities; and electrolytically depositing another conductive material within the cavities.

17 Claims, 3 Drawing Sheets

STRUCTURE AND METHOD FOR FORMING CONDUCTIVE MEMBERS IN AN INTEGRATED CIRCUIT

TECHNICAL FIELD

The present invention relates to the manufacture of interconnections within integrated circuits. In particular, it relates to the manufacture of interconnection formed in cavities etched into a previously formed dielectric layer, often known as a "damascene" process.

BACKGROUND OF THE INVENTION

In known damascene type interconnect formation processes, a pattern of cavities is formed in a dielectric layer to correspond to the required pattern of later formed interconnect wirings and contacts. A metal or other conductive material is deposited over the entire surface of the wafer, to sufficient depth to fill all the cavities in the dielectric layer. A mechanical or chemical-mechanical polishing step is then applied to the wafer to remove the conductive material other than that situated within the cavities. Such polishing is the only way to ensure an almost perfectly planar upper surfaces, with the wirings and contacts being flush with the upper surface of the dielectric.

However, the polishing for the removal of such metal is undesirable because a long time is needed to remove a thick metal layer, thus increasing the total processing time required to produce an integrated circuit.

An object of the present invention is to provide a method for forming damascene type wirings and contacts in integrated circuits where the requirement for the polishing of conductive material is reduced or eliminated.

Another object of the present invention is to provide a novel process for forming contacts and interconnect wirings in integrated circuits.

Another object of the present invention is to provide such a process which easily yields contacts and wirings having upper surfaces which are substantially coplanar with surrounding dielectric layers.

SUMMARY OF THE INVENTION

According to principles of the present invention, a method is provided for forming conductive members in an integrated circuit comprising the steps of:
  a) providing an underlying layer, having an upper surface;
  b) depositing a first dielectric layer on the upper surface of the underlying layer;
  c) forming cavities extending at least partially through the first dielectric layer in locations selected for the formation of the conductive members; and
  d) filling the cavities with a conductive material.
The method includes, between steps (b) and (c), the steps of:
  e) depositing a first conductive layer on an upper surface of the first dielectric layer; and
  f) depositing a second dielectric layer on the first conductive layer, and step (d) includes the steps of:
  g) forming a second conductive layer on all internal surfaces of the cavities; and
  h) electrolytically depositing a further conductive material over the second conductive layer.

According to an embodiment of the present invention, the further conductive material is deposited to a thickness sufficient to substantially fill the cavities.

According to an embodiment of the present invention, step (g) comprises the steps of depositing a second conductive layer over all exposed surfaces of the structure; and removing the second conductive layer from all surfaces of the structure other than the internal surfaces of the cavities.

According to an embodiment of the present invention, the second conductive layer is removed by a polishing process step.

According to an embodiment of the present invention, the method includes, after step (d), the step of polishing the upper surface of the structure to remove excess conductive material protruding above an upper surface of the second dielectric layer.

According to an embodiment of the present invention, the method includes, after step (d), the step of polishing the upper surface of the structure to remove conductive material protruding above the upper surface of the first dielectric layer, and to entirely remove the second dielectric layer and the first conductive layer.

According to an embodiment of the present invention, the underlying layer is a conductive or semiconductive layer, and the cavities extend completely through the first dielectric layer, whereby the resulting conductive member is in contact with the underlying conductive or semiconductive layer.

According to an embodiment of the present invention, the cavities extend only partially through the first dielectric layer, the resulting conductive member being electrically isolated from the underlying layer.

According to an embodiment of the present invention, the underlying layer is a dielectric layer including contact members extending vertically therethrough, the cavities extending completely through the first dielectric layer, whereby the resulting conductive members are interconnect wirings, electrically in contact with the underlying contact members.

Certain embodiments of the current invention will be described, by way of example, with reference to the accompanying diagrams:

DETAILED DESCRIPTION OF THE INVENTION

Figure 1:
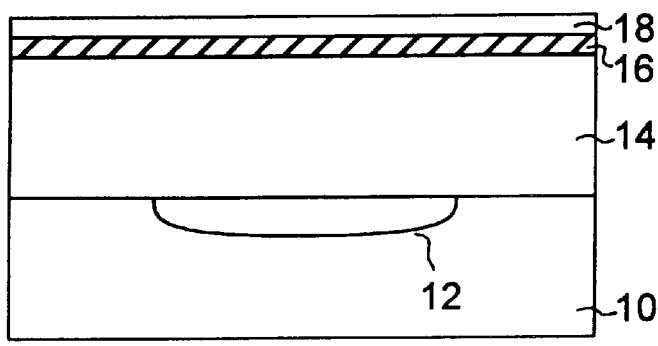
FIGS. 1–4 show a part of an integrated circuit at various stages of a contact-forming process according to the present invention, prior to an electrolytic deposition step.

FIG. 1 shows a portion of a semiconductor integrated circuit, during fabrication. All semiconductor components have been formed. Contact and interconnect structures must be formed, suitably insulated from one another and from the semiconductor.

A semiconductor substrate 10 includes a contact region 12, which is at a location selected for the formation of a conductive member, such as a contact. The contact region may correspond, for example, to a doped region of the substrate such as a transistor source or drain in a MOS integrated circuit. Alternatively, it could correspond to any other type of component available in an integrated circuit. In particular, it could be replaced by a polysilicon or other conductive layer, such as silicide, either in electrical contact with substrate 10 or isolated from it.

A first dielectric layer 14 is deposited over the entire upper surface of the structure. The thickness of this first dielectric layer is determined according to the required thickness of a finished conductive member.

Figure 2:
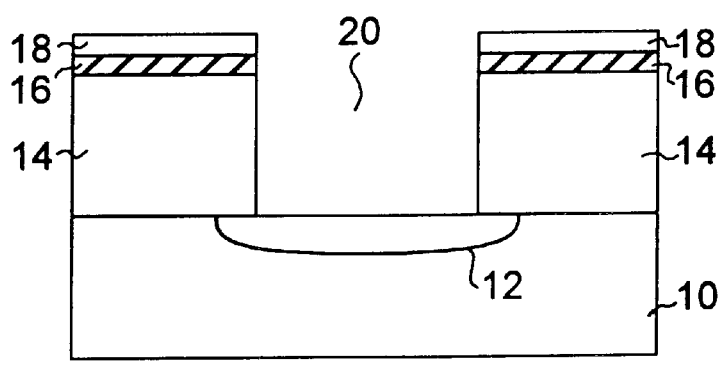

According to an aspect of the invention, a thin, first conductive layer 16 is deposited over the first dielectric layer, and a second dielectric layer 18 is deposited over the first conductive layer. None of the layers 14, 16, 18 have been patterned at this stage. By way of example, the first conductive layer may be a 100 nm thick layer of a metal, deposited at a low temperature. It is preferably aluminum, due to its low resistivity and the low temperature at which it can be deposited. A low deposition temperature is particularly advantageous if dielectric materials of low permitivity ($\epsilon$), the so-called "low k dielectrics" are used, as these may be unstable at high temperatures. However, other conductive materials may be used as well. A layer of titanium or titanium nitride may be used, although such a layer could be unacceptably resistive. Copper has characteristics similar to those of aluminum, but may be difficult to etch later, and may cause contamination. Tungsten is easy to form and to etch, and is a metal commonly used for integrated circuit manufacture, but has a high resistivity. Determining which material to use for the first conductive layer will depend on the design and process parameters of the semiconductor device. As shown in FIG. 2, a cavity 20 is etched in each contact region. The cavity may be formed in a single etch step using an etch chemistry which is non-selective to the materials of layers 14, 16, 18, or the cavity may be formed in several stages, when etch chemistries are used that are selective to the materials of layers 14, 16, 18. In any case, strongly anisotropic etching must be used, as the cavity 20 must have substantially vertical walls and be as smooth as possible. One may envisage the use of a mechanical process to form cavity 20. For example, ion milling may be a suitable mechanical process.

According to an aspect of the invention, parts of first conductive layer 16 are exposed within the cavity 20, but the first conductive layer is otherwise covered with second dielectric layer 18.

Figure 3:
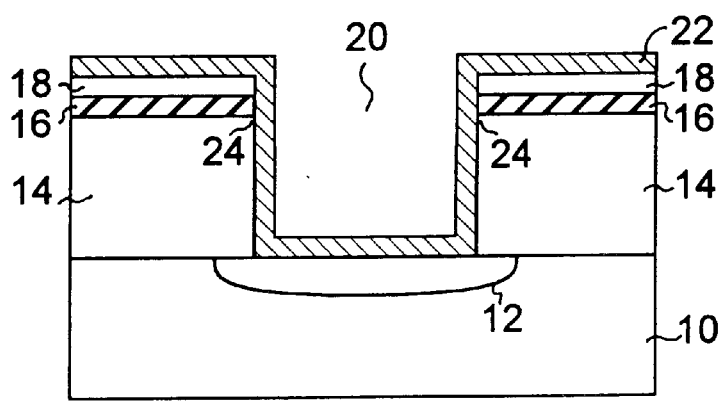

As shown in FIG. 3, a thin second conductive layer 22 is deposited over all exposed surfaces of the structure, in particular on interior surfaces of the cavity 20. Therefore, the second conductive layer is in electrical contact with first conductive layer 16 at continuity regions 24 around the circumference of each cavity 20. The second conductive layer must be of relatively low resistance, as it forms the interface with the contact region 12. For example, suitable materials may be titanium or titanium nitride deposited to a thickness of 20–60 nm by a sputtering process. A copper layer may also be used, but again may cause diffusion or contamination problems. Polysilicon is preferably not used because of its high resistivity and the high temperature required for its deposition. Other materials and thicknesses may be used, provided that the layer 22 is electrically continuous over all interior surfaces of the cavity 20. At this stage in the process, all contact regions on the integrated circuit are electrically connected together both by second conductive layer 22 and first conductive layer 16.

Figure 4:
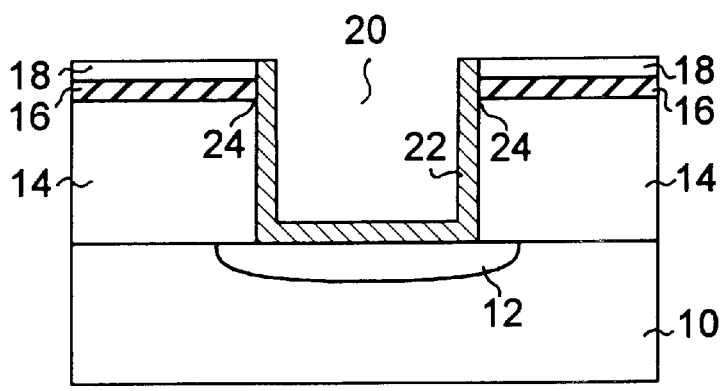

As shown in FIG. 4, the second conductive layer 22 is removed from the structure, other than within the cavities 20. This may be achieved by a mechanical or chemical-mechanical polishing step, or any other appropriate method. As the second conductive layer 22 is relatively very thin, such a polishing step may be of relatively short duration compared with the long times associated with the polishing processes described above in reference to the prior art.

The exposed surface of the structure now comprises an insulating material 18 in all areas other than within the cavities 20. The cavities contain an exposed liner of conductive material 22, all of which are connected together by first conductive layer 16.

Figure 5:
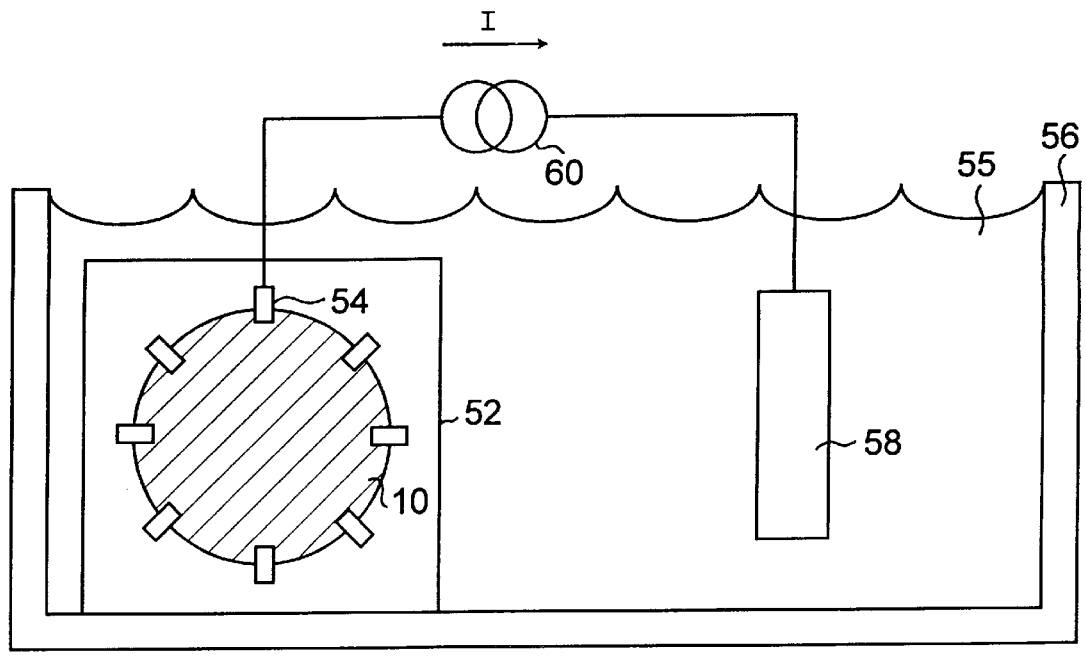
FIG. 5 shows a semiconductor wafer undergoing an electrolytic deposition step.

An electrolytic deposition step must now be performed. FIG. 5 shows a suitable arrangement that may be used.

The semiconductor substrate 10, in the form of a wafer, is mounted upon a mechanical support 52 by clamps 54. The mechanical support and the wafer 10 are immersed in an electrolyte 55 contained within an electrolytic bath 56. An electrode 58 is also placed in the electrolytic bath. At a minimum, the liners of conductive material 22 are electrically connected to one terminal of a current source 60. A second terminal of the current source is connected to the electrode 58. A current is passed by the current source 60 through the electrolyte 55. According to the composition of the electrolyte 55, a conductive material is deposited on all exposed surfaces of wafer 10 that are electrically conductive and connected to the current source. As shown in FIG. 4, only the liners of conductive material 22 fit these criteria. Accordingly, conductive material is deposited only in the cavities 20.

The value of current I and the time during which the current is applied are controlled so that the cavities become filled with conductive material, without excessive overfilling.

An example of a suitable electrolytic bath is a solution of 17 grams per liter of copper sulfate ($CuSO_4$) in an acidic buffer solution, such as 10% sulfuric acid ($H_2SO_4$). By passing a current of 8A for 3–4 minutes, conductive copper may be deposited to a thickness of about 1.5 $\mu$m. The wafer is negatively polarized, while the electrode 58 (the anode) is preferable composed of copper, to ensure that copper ions of the electrolyte, consumed in the deposition of the copper on the wafer 10, are replenished.

The electrolytic deposition may be carried out one wafer at a time, or on a whole batch of wafers, provided that suitable electrical connections are provided for each wafer.

Figure 6:
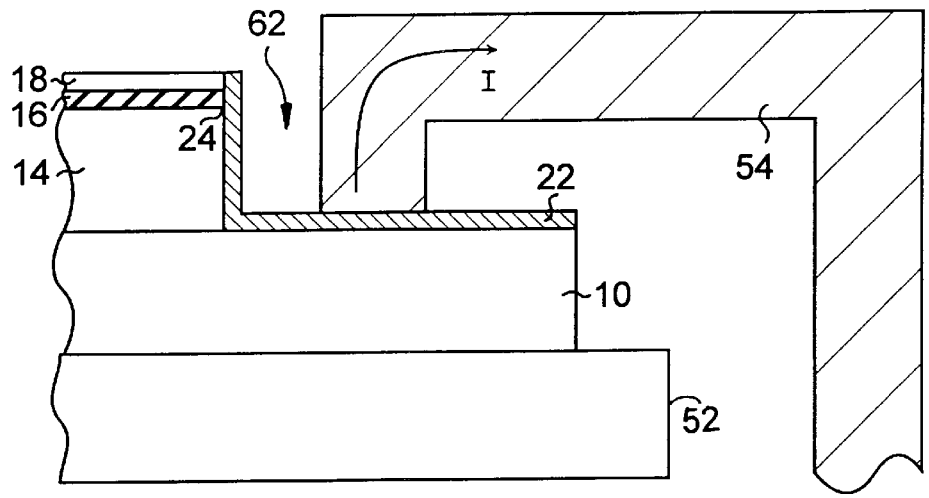
FIG. 6 shows, in detail, a part of a semiconductor wafer according to the present invention, mounted in a mechanical support used for electrolytic deposition.

FIG. 6 shows in detail a clamp 54 used to retain wafer 10 against mechanical support 52, while providing electrical contact to an electrode contact zone 62. The electrode contact zone 62 is an enlarged cavity, extending right up to the edge of the wafer 10. It may have dimensions of several millimeters. It is formed in the same manner as the cavity of FIG. 4. The enlarged cavity contains a liner of conductive material 22, but is open at the edge of the wafer. As with all cavities, the liner is in electrical contact with the first conductive layer 16 at a continuity region 24.

Clamp 54 is composed of an electrically conductive material, which is in contact with the liner 22 of the contact zone 62. By connecting clamp 54 to the current source 60, all of the liners of cavities on wafer 10 are polarized, and may serve as deposition sites in the electrolytic deposition process.

Although only one clamp 54 and contact zone 62 are sufficient to ensure the necessary electrical conductivity, the resulting electrolytic deposition could be uneven. To ensure an even deposition across the whole surface of the wafer, several clamps 54 and contact zones should be provided. At least six, and preferably as many as twelve contact zones and corresponding clamps should be used to ensure even electrolytic deposition of conductive material.

Figure 7:
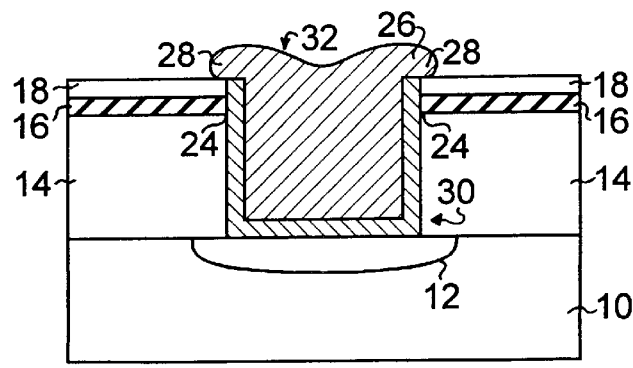
FIGS. 7–9 show a part of an integrated circuit at various stages of a contact-forming process according to the present invention, following the electrolytic deposition step.

FIG. 7 shows the structure at the end of the electrolytic deposition operation. Conductive material 26 has been deposited to a thickness sufficient to fill the cavity 20. As the conductive material 26 will deposit on any exposed conductive surface, it is likely that some deposited material 28 will overflow from the cavity 20 to form an enlarged head to the contact 30 so formed. The upper surface 32 may contain a slight depression at its center. This shaping of the upper surface of the contact 30 may make it particularly suitable for use as a bonding pad.

Figure 8:
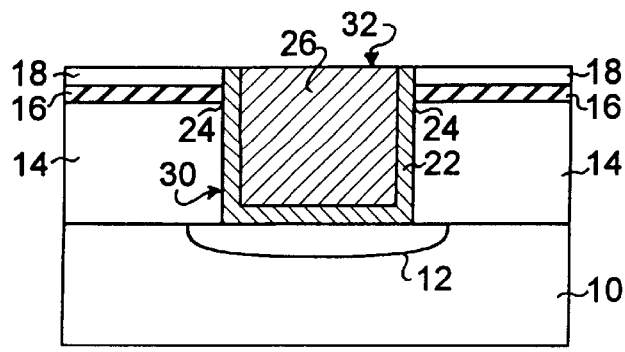

As shown on FIG. 8, the conductive material 28 deposited outside of the cavity is removed, and the contact 30 planarized such that its upper surface is approximately coplanar with the upper surface of the second dielectric layer 18. This may be achieved by dipping the structure in a wet etch bath. The etch should be selective to the material of the second dielectric layer 18. For example, if the conductive material 26 is copper, diluted sulfuric acid may be used. A mechanical or chemical-mechanical polishing step could also be used.

FIG. 8 shows the resulting structure. The contact 30 has an approximately planar upper surface 32, approximately coplanar with the upper surface of second dielectric layer 18. All such contacts 30 in the integrated circuit, as well as all contact regions 12, are in mutual electrical contact, due to the presence of first conductive layer 16. Obviously, the integrated circuit will be unable to function in this state. First conductive layer 16 has served its main purpose and should be removed, either completely or from all but specific selected locations.

Figure 9:
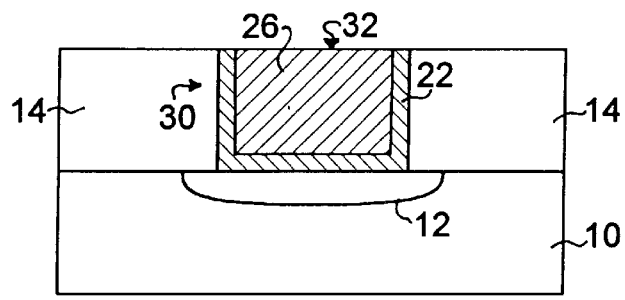

FIG. 9 shows the structure, according to a first embodiment of the invention. A non-selective etch has been used to remove the second dielectric layer 18, all of the first conductive layer 16 and part of the contact 30 from its upper surface 32. The resulting structure has a very planar upper surface. A wet etch, a plasma or other dry etch may be used, or a short mechanical or chemical-mechanical polishing step.

Contacts 30 have been formed through dielectric layer 14 in a damascene-like process, while avoiding the need to mechanically or chemically-mechanically polish away a large quantity of conductive material such as metal. The drawbacks of such etching away, described with reference to the prior art, are thereby avoided.

In an alternative embodiment, a selective etch or masking and etching may be used to retain conductive layer 16 at specific selected locations where connections of some contacts to each other are desired or where improved conductivity, or etch stops, or other benefits from conductive layer 16 are desired.

Figure 10:
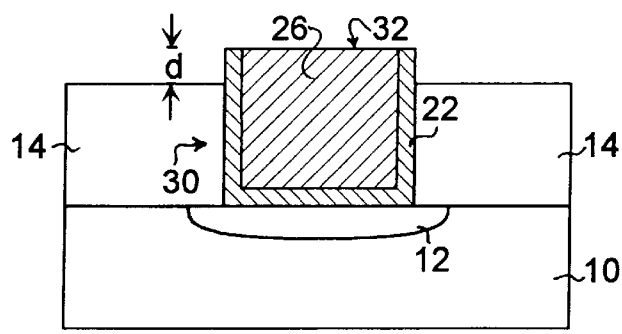
FIG. 10 shows a contact structure according to a second embodiment of the invention.

FIG. 10 shows a structure according to a second embodiment of the present invention, which results from a selective etch of the second dielectric layer 18 and the first conductive layer 16. Such an etch may be performed by dipping the structure in a wet etch bath, or a selective dry etch process. If second dielectric layer 18 is composed of silicon dioxide, or a silicon dioxide based glass, first conductive layer 16 is composed of aluminum, second conductive layer 22 of titanium nitride and further conductive material 26 of copper, suitable etching may be performed by first immersing the structure in a solution of hydrogen fluoride (HF), then in a phosphoric acid ($H_3PO_4$) based aluminum etching solution. The resulting structure is less planar than the structure of FIG. 9, but the wet etching may be carried out much more rapidly than the polishing or ion milling that may be required to produce a structure such as that shown in FIG. 9. The non-planarity of the structure—the step height d—corresponds to no more than the sum of the thicknesses of the first conductive layer 16 and the second dielectric layer 18. As discussed above, this may be of the order of 200 nm, which is negligible in comparison to the thickness of the dielectric layer 12, some 1000 nm.

Figure 11:
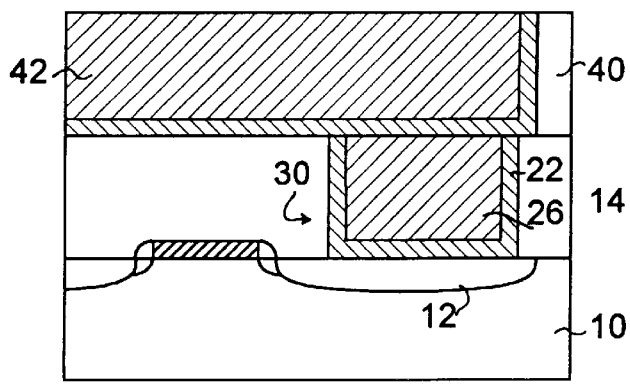
FIG. 11 shows a contact and wiring structure according to a third embodiment of the present invention.

FIG. 11 shows a structure according to a third embodiment of the invention. The process described in relation to FIGS. 1–9 is repeated for a further dielectric layer 40. A suitable etch stop layer may be placed between first dielectric layer 14 and further dielectric layer 40, and any of the techniques known in single damascene processing may be used to permit etching of a wiring pattern in the further dielectric layer 40. Wirings 42 are formed, substantially coplanar with the further dielectric layer 40, allowing electrical connection to be made between several contacts 30, or to pads for connection to package pins for the finished integrated circuit.

Figure 12:
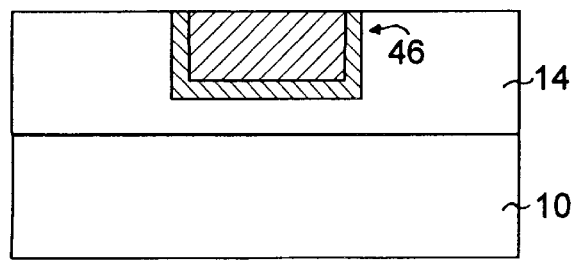
FIG. 12 shows a wiring structure according to a fourth embodiment of the present invention.

FIG. 12 shows a structure according to a fourth embodiment of the present invention. By stopping the etch discussed with reference to FIG. 2 before the underlying layer 10 is exposed, a cavity is formed extending only partially through the first dielectric layer 14. Since the cavity liner 22, (FIG. 4) is electrically connected by first conductive layer 16 near the upper extremity of the cavity, such a partial depth cavity is filled in the same way as a full depth cavity. A wiring 46, isolated from the underlying layer, may thereby be created. By providing suitably differential masking and etching steps, both wirings 46 and contacts 30 may be provided in one and the same dielectric layer.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of forming conductive members in an integrated circuit comprising the steps of:

a) providing an underlying layer, having an upper surface;

b) depositing a first dielectric layer on the upper surface of the underlying layer;

c) depositing a first conductive layer on an upper surface of the first dielectric layer;

d) depositing a second dielectric layer on the first conductive layer;

e) after steps a)–d) forming cavities extending at least partially through the first dielectric layer in locations selected for the formation of the conductive members;

f) after steps a)–e), forming a second conductive layer on all internal surfaces of the cavities; and g) electrolytically depositing a further conductive material over the second conductive layer.

2. A method according to claim 1 wherein the further conductive material is deposited to a thickness sufficient to substantially fill the cavities.

3. A method according to claim 1 wherein step (f) comprises the steps of:
depositing the second conductive layer over all exposed surfaces of the structure; and
removing the second conductive layer from all surfaces of the structure other than the internal surfaces of the cavities.

4. A method according to claim 3 wherein the removing step includes polishing the second conductive layer.

5. A method according to claim 1 further including, after step (g), the step of polishing the second conductive layer to remove excess conductive material protruding above an upper surface of the second dielectric layer.

6. A method according to claim 1 further including, after step (g), the step of polishing the first and second conductive layers and the second dielectric to remove conductive material protruding above the upper surface of the first dielectric layer, and to entirely remove the second dielectric layer and the first conductive layer.

7. A method according to claim 1 wherein the underlying layer is a conductive or semiconductive layer, and the cavities extend completely through the first dielectric layer, whereby the resulting conductive member is in contact with the underlying conductive or semiconductive layer.

8. A method according to claim 1 wherein the cavities extend only partially through the first dielectric layer, the resulting conductive member being electrically isolated from the underlying layer.

9. A method according to claim 1 wherein the underlying layer includes a third dielectric layer and contact members extending vertically therethrough, the cavities extending completely through the first dielectric layer, whereby the resulting conductive members are interconnect wirings, electrically in contact with the underlying contact members.

10. A method of forming conductive members in an integrated circuit having an underlying layer with an area to be electrically connected and a first dielectric layer covering the underlying layer, the method comprising:
depositing a first conductive layer over the first dielectric layer;
depositing a second dielectric layer over the first conductive layer, the second dielectric layer having a top surface;
after depositing the first conductive layer and the second dielectric layer, etching a contact via through the second dielectric layer, the first conductive layer, and the first dielectric layer and exposing the area to be electrically connected on the underlying layer;
covering all internal surfaces of the contact via with a second conductive layer and electrically contacting the first conductive layer and the area to be electrically connected on the underlying layer on surfaces exposed by the etching step; and
depositing a conductive material on the second conductive layer filling the contact via using an electrolytic process.

11. The method of forming conductive members according to claim 10 wherein covering all internal surfaces of the contact via comprises:
depositing a second conductive layer covering the top surface of the second dielectric layer and all internal surfaces of the contact via; and
removing the second conductive layer from the top surface of the second dielectric layer leaving only the second conductive layer covering the internal surfaces of the contact via.

12. The method of forming conductive members according to claim 10 wherein etching a contact via comprises a chemical etch process.

13. The method of forming conductive members according to claim 10 wherein etching a contact via comprises a mechanical etch process.

14. The method of forming conductive members according to claim 10 further including:
removing any conductive material deposited from the electrolytic process in contact with the top surface of the second dielectric layer;
removing the second dielectric layer; and
removing the first conductive layer.

15. The method of forming conductive members according to claim 14 wherein removing the second dielectric layer and removing the first conductive layer comprise a chemical etch process.

16. The method of forming conductive members according to claim 14 wherein removing the second dielectric layer and removing the first conductive layer comprise a mechanical etch process.

17. A method of forming conductive members in an integrated circuit having an underlying layer with a top surface and a first dielectric layer covering the underlying layer, the method comprising:
depositing a first conductive layer over the first dielectric layer;
depositing a second dielectric layer over the first conductive layer, the second dielectric layer having a top surface;
after depositing the first conductive layer and the second dielectric layer, etching a channel through the second dielectric layer, the first conductive layer, and into the first dielectric layer without exposing the top surface of the underlying layer;
covering all internal surfaces of the contact via with a second conductive layer and electrically contacting the first conductive layer exposed by the etching step; and
depositing a conductive material on the second conductive layer filling the contact via using an electrolytic process.

* * * * *